US007015516B2

(12) United States Patent
Eliashevich et al.

(10) Patent No.: US 7,015,516 B2
(45) Date of Patent: Mar. 21, 2006

(54) LED PACKAGES HAVING IMPROVED LIGHT EXTRACTION

(75) Inventors: Ivan Eliashevich, Maplewood, NJ (US); Robert F. Karlicek, Jr., Santa Maria, CA (US); Hari Venugopalan, Somerset, NJ (US)

(73) Assignee: GELcore LLC, Valley View, OH (US)

(*) Notice: Subject to any disclaimer, the term of this patent is extended or adjusted under 35 U.S.C. 154(b) by 32 days.

(21) Appl. No.: 10/417,000

(22) PCT Filed: Nov. 14, 2001

(86) PCT No.: PCT/US01/44046

§ 371 (c)(1), (2), (4) Date: Nov. 20, 2003

(87) PCT Pub. No.: WO02/41364

PCT Pub. Date: May 23, 2002

(65) Prior Publication Data

US 2004/0070004 A1 Apr. 15, 2004

Related U.S. Application Data

(60) Provisional application No. 60/249,238, filed on Nov. 16, 2000.

(51) Int. Cl.
*H01L 33/00* (2006.01)

(52) U.S. Cl. .......................... 257/103; 257/95; 257/98; 257/99; 257/103; 438/700; 438/701; 438/734; 438/737

(58) Field of Classification Search .................. 257/95, 257/98, 99, 103; 438/700, 701, 734, 737
See application file for complete search history.

(56) References Cited

U.S. PATENT DOCUMENTS

| | | | | |
|---|---|---|---|---|
| 4,476,620 A | 10/1984 | Ohki et al. | | |
| 5,040,044 A | 8/1991 | Noguchi et al. | | |
| 5,214,306 A | 5/1993 | Hashimto | | |
| 5,429,954 A | 7/1995 | Gerner | | |
| 5,563,422 A | 10/1996 | Nakamura et al. | | |
| 5,779,924 A | 7/1998 | Krames et al. | | |
| 6,140,248 A | 10/2000 | Fischer et al. | | |
| 6,177,352 B1 * | 1/2001 | Schonfeld et al. | .......... | 438/701 |
| 6,495,862 B1 * | 12/2002 | Okazaki et al. | ............. | 257/103 |
| 6,531,408 B1 * | 3/2003 | Iwata et al. | ................. | 438/758 |

* cited by examiner

FOREIGN PATENT DOCUMENTS

WO WO-98/07187 A1 2/1998

*Primary Examiner*—Mai-Huong Tran
(74) *Attorney, Agent, or Firm*—Fay, Sharpe, Fagan Minnich & McKee, LLP

(57) ABSTRACT

A light-emitting microelectronic package includes a light-emitting diode (110) having a first region (114) of a first conductivity type, a second region (116) of a second conductivity type, and a light-emitting p-n junction (118) between the first and second regions. The light-emitting diode defines a lower contact surface (120) and a mesa (122) projecting upwardly from the lower contact surface. The first region (114) of a first conductivity type is disposed in the mesa (122) and defines a top surface of the mesa, and the second region (116) of a second conductivity type defines the lower contact surface that substantially surrounds the mesa (122). The mesa includes at least one sidewall (130) extending between the top surface (124) of the mesa and the lower contact surface (120), the at least one sidewall (130) having a roughened surface for optimizing light extraction from the package.

20 Claims, 8 Drawing Sheets

LED PACKAGES HAVING IMPROVED LIGHT EXTRACTION

The present invention relates to making semiconductor packages and more particularly relates to methods of making light-emitting microelectronic packages having optimized light extraction characteristics.

BACKGROUND OF THE INVENTION

Referring to FIG. 1, conventional light-emitting diodes or "LEDs" include thin layers of semiconductor material of two opposite conductivity types, typically referred to as p-type layers 20 and n-type layers 22. The layers 20, 22 are typically disposed in a stack, one above the other, with one or more layers of n-type material in one part of the stack and one or more layers of p-type material at an opposite end of the stack. Each LED typically includes a p-n junction layer 24 provided between the p-type and n-type layers. The various layers of the stack are deposited on a substrate 26, such as a sapphire substrate. The substrate may be cut to form a plurality of LED packages, each package including one or more light-emitting diodes and a portion of the substrate.

In operation, electric current passing through the LED package is carried principally by electrons in the n-type layer 22 and by electron vacancies or "holes" in the p-type layer 20. The electrons and holes move in opposite directions toward junction layer 24, and recombine with one another at the junction. Energy released by the electron-hole recombination is emitted from the LED as light 28. As used herein, the term "light" includes visible light rays, as well as light rays in the infrared and ultraviolet wavelength ranges. The wavelength of the emitted light 28 depends on many factors, including the composition of the semiconductor materials and the structure of the junction 24.

FIG. 2 shows a typical LED package 10 including p-type and n-type semiconductor layers 20, 22 mounted atop substrate 26. The LED is surrounded by a substantially transparent encapsulant 30. Each layer of the package has its own unique index of refraction. As used herein, the term "refraction" means the optical phenomenon whereby light entering a transparent medium has its direction of travel altered. In FIG. 2, LED 18 has an index of refraction designated $n_1$, the transparent substrate 26 has an index of refraction designated $n_2$ and the encapsulant layer 30 has an index of refraction designated $n_3$. Because the index of refraction of the substantially transparent substrate 26 $n_2$ is greater than the index of refraction of the transparent encapsulant 30 $n_3$, many of the light rays generated by LED 18 are internally reflected back into the package and are not extracted therefrom. This is due to the optical phenomenon known as total internal reflection, whereby light incident upon a medium having a lesser index of refraction (e.g. encapsulant layer 30) bends away from the normal so that the exit angle of the light is greater than the incident angle $\theta_i$. As $\theta_i$ increases, the exit angle approaches 90° for a critical incident angle $\theta_c$, calculated using Snell's Law. For light rays having incident angles $\theta_i$ greater than the critical angle $\theta_c$, the light ray will be subject to total internal reflection. As shown in FIG. 2, the incident angle $\theta_i$ for light ray 32 is greater than $\theta_c$. As a result, light ray 32 is totally internally reflected within package 10.

Thus, in many LED packages the light rays generated by the LED are never extracted from the chip because such light rays are totally internally reflected within the package. Thus, there is a need for improved LED chips that optimize the amount of light that may be extracted from the packages. There is also a need for methods of making such chips.

SUMMARY OF THE INVENTION

In accordance with certain preferred embodiments of the present invention, a light-emitting microelectronic package includes a light-emitting diode having a first region of a first conductivity type, a second region of a second conductivity type, and a light-emitting p-n junction between the first and second regions. The light-emitting diode preferably defines a lower contact surface and a mesa projecting upwardly from the lower contact surface. The first region of a first conductivity type is being disposed in the mesa and defines a top surface of the mesa, and the second region of a second conductivity type defines the lower contact surface that substantially surrounds the mesa. The mesa desirably includes at least one sidewall extending between the top surface of the mesa and the lower contact surface, the at least one sidewall having a roughened surface for improving light extraction from the package. The light-emitting diode preferably overlies a substantially transparent dielectric substrate having a top surface, a bottom surface and at least one sidewall extending between the top and bottom surfaces. In certain preferred embodiments, the at least one sidewall of the substantially transparent dielectric substrate has a roughened surface for minimizing the number of light rays that are subject to internal reflection and for improving the emission of light passing through the substrate.

The light-emitting diode may include materials selected from the group consisting of semiconductors such as III-V semiconductors, as for example, materials according to the stoichiometric formula $Al_aIn_bGa_cN_xAs_yP_z$ where (a+b+c) is about 1 and (x+y+z) is also about 1. Most typically, the semiconductor materials are nitride semiconductors, i.e., III-V semiconductors in which x is 0.5 or more, most typically about 0.8 or more. Most commonly, the semiconductor materials are pure nitride semiconductors, i.e., nitride semiconductors in which x is about 1.0. The term "gallium nitride based semiconductor" as used herein refers to a nitride based semiconductor including gallium. The p-type and n-type conductivity may be imparted by conventional dopants and may also result from the inherent conductivity type of the particular semiconductor material. For example, gallium nitride based semiconductors typically are inherently n-type even when undoped. N-type nitride semiconductors may include conventional electron donor dopants such as Si, Ge, S, and O, whereas p-type nitride semiconductors may include conventional electron acceptor dopants such as Mg and Zn. The substrate is preferably substantially transparent and made of a dielectric material. In certain preferred embodiments, the substrate is selected from a group of materials including sapphire, GaN, AlN, ZnO, and LiGaO. In more preferred embodiments, the LEDs are GaN LEDs and the substrate is made of sapphire.

Each light-emitting diode preferably defines a lower contact surface and a mesa projecting upwardly from the lower contact surface, the first region of the LED being disposed in the mesa and defining a top surface of the mesa, and the second region of the LED defining the lower contact surface. In certain preferred embodiments, the lower contact surface substantially surrounds the mesa. The mesa desirably includes at least one sidewall extending between the top surface of the mesa and the lower contact surface, at least one sidewall of the mesa having a roughened surface for improving light extraction from the LED package. Although the present invention is not limited by any particular theory of operation, it is believed that providing a LED package including a mesa with one or more roughened sidewalls will reduce the number of light rays totally internally reflected within the package. Such light rays will have a greater probability of passing through the one or more roughened sidewalls of the LED package, thereby optimizing the amount of light extracted from the LED package.

In certain preferred embodiments, the LED package desirably includes a substantially transparent substrate having a top surface, a bottom surface and at least one sidewall extending between the top and bottom surfaces. A light-emitting diode is preferably secured over the substantially transparent substrate. In certain embodiments, at least one of the sidewalls of the substantially transparent substrate has a roughened surface. In other embodiments, the package has a width and a height, the ratio of the width to the height defining an aspect ratio for the package that is approximately 2:1 or less.

In certain preferred embodiments, the light-emitting diode includes an upper contact accessible at the top surface of the mesa and a lower contact accessible at the lower contact surface of the stacked structure. The mesa may be in the form of a rectangular solid and the top surface of the mesa may be substantially rectangular. In other preferred embodiments, the top surface of the mesa may be substantially square. The lower contact overlying the lower contact surface may be a substantially rectangular loop that substantially surrounds the mesa. In certain embodiments, the stacked structure may also include an indentation in at least one of the sidewalls of the mesa. The indentation preferably extends downwardly from the top surface of the mesa to the lower contact surface, the lower contact being at least partially disposed within the indentation. In one preferred embodiment, the indentation extends into the mesa at a comer of the top surface of the mesa.

At least a portion of the first region of the stacked structure defines the top surface of the mesa and comprises one or more nitride semiconductors. The first conductivity type of the first region is preferably a p-type material and the second conductivity type of the second region is preferably a n-type material.

In other preferred embodiments, a light-emitting microelectronic package includes a substantially transparent substrate that is desirable made of a dielectric material having a width and a height, and a light-emitting diode overlying the substantially transparent substrate. The light-emitting diode preferably includes a first region of a first conductivity type, a second region of a second conductivity type and a light-emitting p-n junction between the regions, wherein the substantially transparent substrate has a width to height aspect ratio of 2:1 or less. In particular preferred embodiments, the aspect ratio of the substantially transparent substrate is approximately 1:1. The substantially transparent substrate desirably has a top surface adjacent the light-emitting diode, a bottom surface remote from the light-emitting diode and at least one sidewall extending between the top and bottom surfaces thereof. The at least one sidewall preferably has a roughened surface for improving light extraction from the package. The light-emitting diode may include a stacked structure having a first region of a first conductivity type, a second region of a second conductivity type and a light-emitting p-n junction between the first and the second regions. The stacked structure desirably defines a lower contact surface and a mesa projecting upwardly from the lower contact surface, the first region being disposed in the mesa and defining a top surface of the mesa, and the second region defining the lower contact surface, the lower contact surface substantially surrounding the mesa. The mesa desirably has at least one sidewall extending between the lower contact surface and the top surface thereof, wherein the at least one sidewall of the mesa includes a roughened surface for improving light extraction from the package.

Another preferred embodiment of the present invention provides a light-emitting microelectronic package including a substantially transparent dielectric substrate having a top surface, a bottom surface and at least one sidewall extending between the top and bottom surfaces, and a light-emitting diode overlying the substantially transparent dielectric substrate. The light-emitting diode desirably includes a first region of a first conductivity type, a second region of a second conductivity type and a light-emitting p-n junction between the regions that emits light having a wavelength. The at least one sidewall of the substantially transparent dielectric substrate preferably includes a roughened surface having a pattern that is matched to the wavelength of the light emitting by the light-emitting p-n junction for optimizing the amount of light emitted from the package. The pattern of the roughening may define a defraction grating matched with the wavelength of the light generated by the LED.

In other preferred embodiments of the present invention, a method of making a light-emitting diode package includes providing a substantially transparent substrate having a top surface and a bottom surface, and securing one or more light-emitting diodes over the top surface of the substantially transparent substrate. The method includes separating the substantially transparent substrate to provide individual packages, whereby each individual package includes at least one light-emitting diode secured over a separated portion of the substantially transparent substrate. Each separated portion of the substrate desirably has a width, the width of the substrate being no greater than approximately twice the height of the package.

In certain preferred embodiments, each separated portion of the substrate has at least one sidewall extending between the top and bottom surfaces thereof, whereby at least one sidewall of the substrate is roughened. The sidewalls of the substrate may be roughened by sawing the substrate, by laser ablation, or by using an etching process. One preferred etching process includes a reactive ion etching (RIE) process.

In still other preferred embodiments, a method of making a light-emitting microelectronic package includes forming a light-emitting diode having a first region of a first conductivity type, a second region of a second conductivity type, and a light-emitting p-n junction between the first and second regions, the light-emitting diode defining a lower contact surface and a mesa projecting upwardly from the lower contact surface, the first region of a first conductivity type being disposed in the mesa and defining a top surface of the mesa, and the second region of a second conductivity type defining the lower contact surface that substantially surrounds the mesa. The mesa desirably includes at least one sidewall extending between the top surface of the mesa and the lower contact region. The method includes roughening the at least one sidewall of the mesa for improving light extraction from the package. The light-emitting diode may be mounted atop a substantially transparent dielectric substrate, wherein light generated by the light-emitting diode is passable through the dielectric substrate. The substantially transparent dielectric substrate may have one or more sidewalls having a roughened surface for enhancing light extraction from the package.

These and other preferred embodiments of the present invention will be described in more detail below.

BRIEF DESCRIPTION OF THE DRAWINGS

FIGS. 3A-1–3E-2 show a method of making a LED having one or more roughened sidewalls, in accordance with certain preferred embodiments of the present invention.

DETAILED DESCRIPTION OF THE PREFERRED EMBODIMENTS

Figure 1:
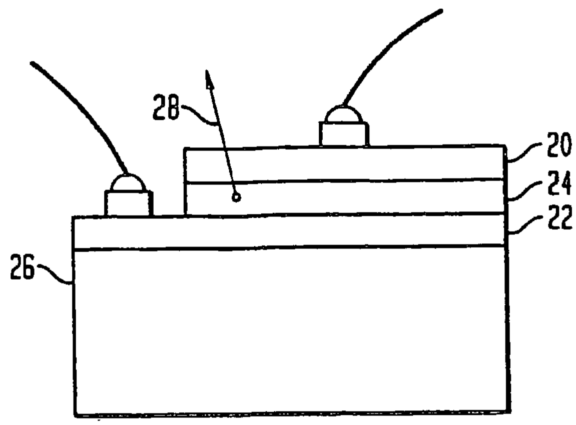
FIG. 1 shows a front elevation view of a conventional LED package.
Figure 2:
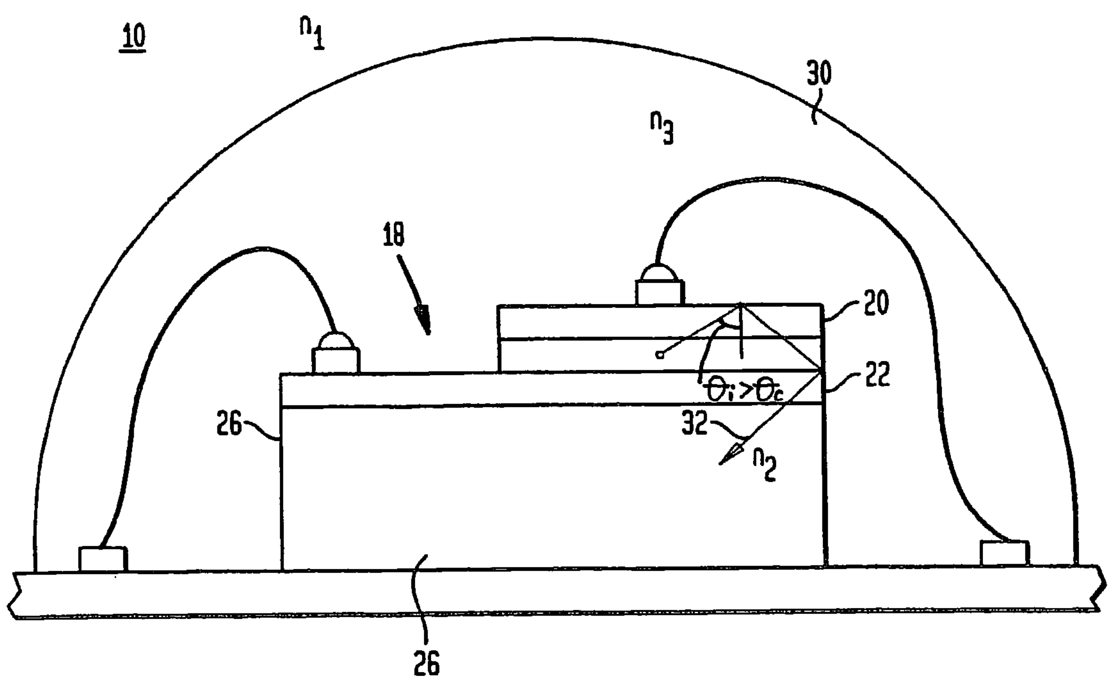
FIG. 2 shows a front elevation view and the LED package of FIG. 1 mounted atop a printed circuit board and sealed in an encapsulant.
Figures 1, 3A:
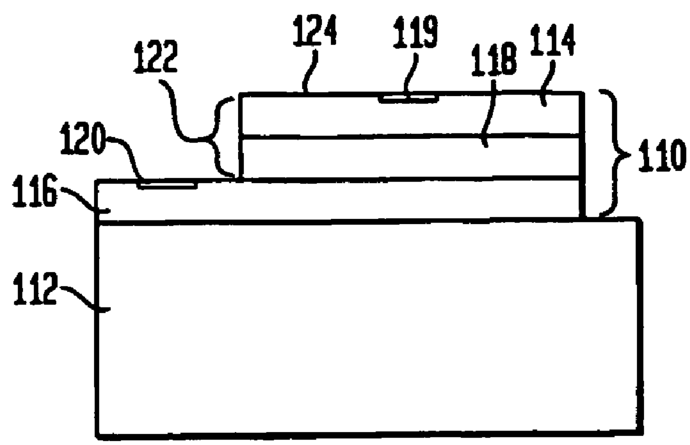
Figures 2, 3A:
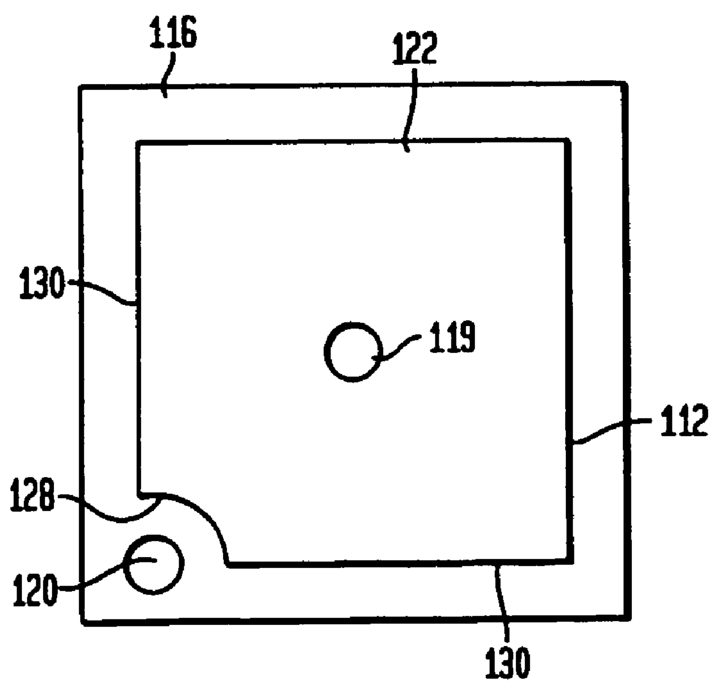

Referring to FIGS. 3A-1 and 3A-2, a light-emitting microelectronic package having improved light extraction characteristics may be made using well known fabrication processes. In certain preferred embodiments, a light-emitting diode for the package is formed by depositing layers on a substrate using techniques such as metal organic chemical vapor deposition ("MOCVD"), molecular beam epitaxy and the like. In certain preferred embodiments, the method forms a stacked structure 110 of semiconductor material on a substrate 112. The stacked structure of semiconductor material may include a first region 114 of a first conductivity type and a second region 116 of a second conductivity type. Because the layers of the stack 110 are deposited atop one another, the second region 116 of the stack is typically deposited atop substrate 112, and the first region 114 is deposited atop the second region 116.

Referring to FIG. 3A-1, the stacked LED structure 110 preferably includes a junction layer 118 between the first and second regions 114, 116. In practice, the first and second regions 114, 116 may abut one another so that they define the junction layer 118 at their mutual border. Alternatively, the junction layer 118 may include additional layers adjacent first and second regions 114, 116 or between the first and second regions. Thus, the junction layer may be a simple homojunction, a single heterojunction, a double heterojunction, a single quantum well, a multiple quantum well or any other type of junction structure.

The first and second regions 114, 116 may include any number of layers. In certain preferred embodiments, the second region 116 may incorporate a "buffer layer" at an interface between second region 116 and substrate 112. Moreover, the first region 114 may incorporate a highly doped contact layer at the top of the stack to aid in establishing ohmic contact with a top electrode 119. The first region 114 is preferably transparent to light at a wavelength which will be emitted by the LED. In other words, the first region is formed principally from materials having a band gap greater than the energy of the photons emitted at junction layer 118. The structure and composition of the various layers incorporated in the LED stack and the sequence of layers in the stack may be selected according to known principles and techniques to provide the desired emission characteristics. The second region 116 may define a lower contact surface 120 that faces away from substrate 112.

The stacked LED structure also preferably defines a mesa 122 projecting upwardly from the lower contact surface 120. The junction 118 and the first region 114 are desirably disposed within the mesa 122, with first region 114 defining the top surface 124 of mesa 122. In certain preferred embodiments, after the stacked LED structure 110 has been formed on substrate 112, the lower contact surface 120 and mesa 122 of the LED are formed using an etching process. Thus, the layers which form the first region 114 and junction 118, and possibly a portion of the layer or layers which form the second region 116, may be removed by selectively etching those areas which form the lower contact surface 120, whereas the areas of the LED stack forming the mesa are not etched away. Such an etching process may use, for example, conventional photolithographic masking techniques. In certain preferred embodiments, an etching mask may be used to protect the mesa during the etching operation. The etching mask may later be used as an electrode or contact for the first region 114.

In other preferred embodiments, the mesa 122 may be defined by selective deposition. In a selective deposition process, the areas of the die forming the lower contact surface may be covered with a masking material, or otherwise shielded from the deposited layers, so that the uppermost layers in the LED stack are not formed in these areas.

One skilled in the art should recognize that the figures are not drawn to scale. Specifically, the thicknesses of the various layers, and particularly junction layer 118, are greatly exaggerated for the purpose of providing a clear illustration of the present invention. Typically, the entire LED including mesa 122 is on the order of five microns thick. The horizontal dimensions of the die, such as the overall width and length of the die are on the order of a few hundred microns (e.g. 200–1000 microns).

Referring to FIG. 3A-1, the shape of mesa 122 is substantially similar to the overall shape of the die. Thus, around the perimeter of the die, the vertically extensive sidewall 130 of mesa 122 extends in directions generally parallel to the adjacent edge of the die. The mesa 122 may have an indentation 128 at one corner that extends downwardly from the top surface 124 of the mesa to the lower contact surface 120, and inwardly from the sidewalls 130 defining the edges of the mesa. In certain preferred embodiments, indentation 128, when seen in top plan view, is generally in the form of a quarter-circle, having a radius of approximately 60–90 microns.

Figures 1, 3B:
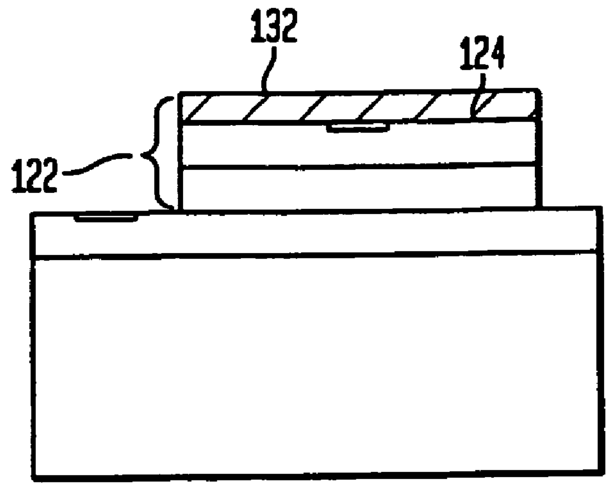
Figures 2, 3B:
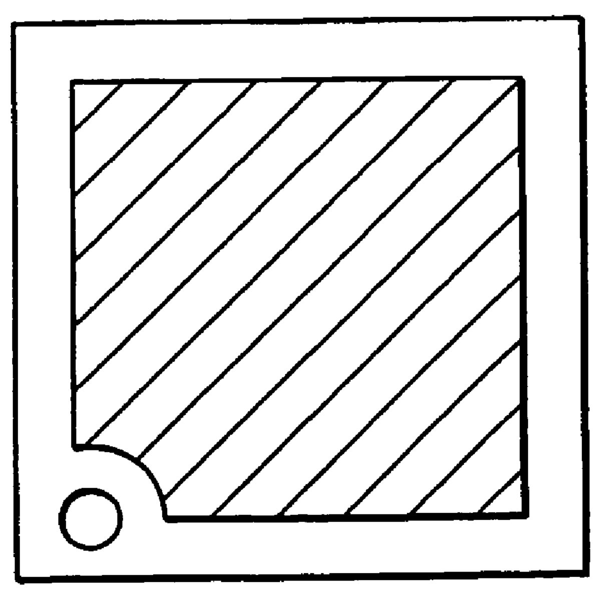
Figures 1, 3C:
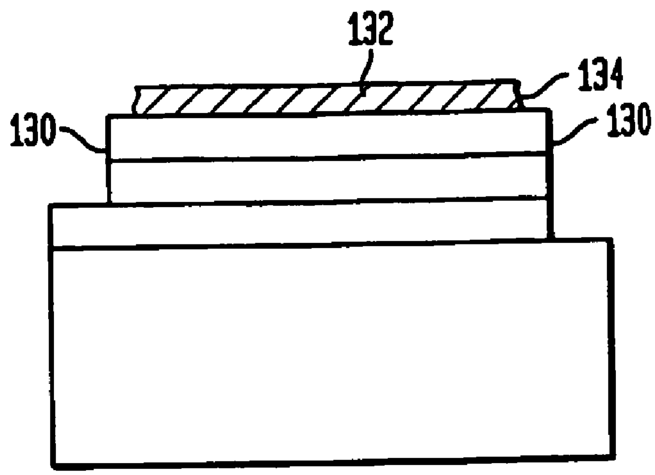
Figures 2, 3C:
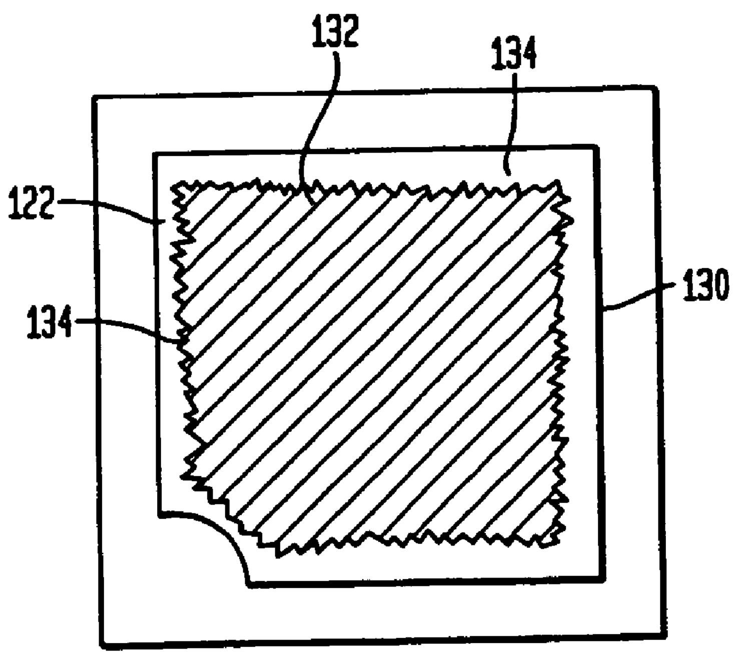

Referring to FIGS. 3B-1 and 3B-2, in one preferred embodiment, a masking layer 132 is deposited over top surface 124 of mesa 122. In preferred embodiments, masking layer 132 is a conductive material such as metal. Referring to FIGS. 3C-1 and 3C-2, the thin metal film 132 is preferably converted to grains of a desired size so that when photolithographically defined, a patterned metal film with one or more rough metal edges 134 is defined. The rough metal edges 134 are preferably slightly receded from mesa sidewalls 130 so that the top surface 124 of the mesa 122 adjacent the sidewalls 130 of the mesa is exposed. As will be described below, the exposed portions of mesa 122 are etched away to provide a mesa having roughened sidewalls.

Figures 1, 3D:
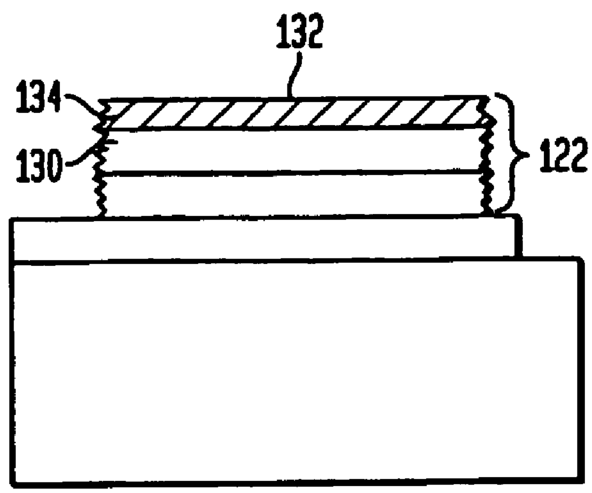
Figures 2, 3D:
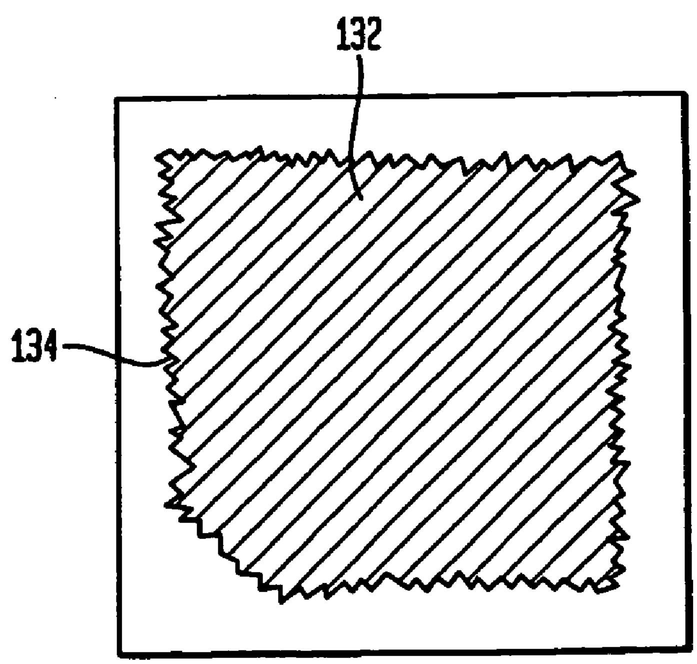
Figures 1, 3E:
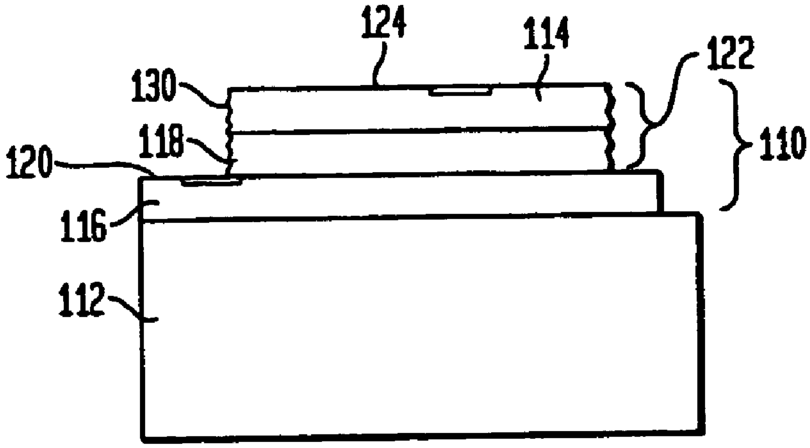
Figures 2, 3E:
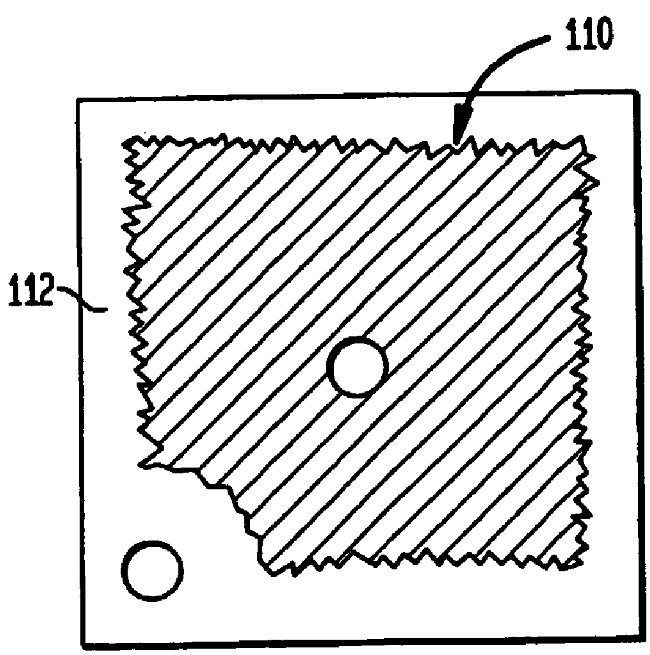

Referring to FIGS. 3D-1 and 3D-2, during an etching process the roughness of rough metal edge 134 of masking layer 132 is transferred to mesa 122. Any preferred etching process may be used. One preferred etching process includes reactive ion etching (RIE). In other preferred embodiments, masking layer 132 may be thermally treated for creating the rough metal edge 134. After the etching step, the masking layer 132 may be removed. FIGS. 3E-1 and 3E-2, show the sidewalls of the mesa having a roughened surface.

Figure 4:
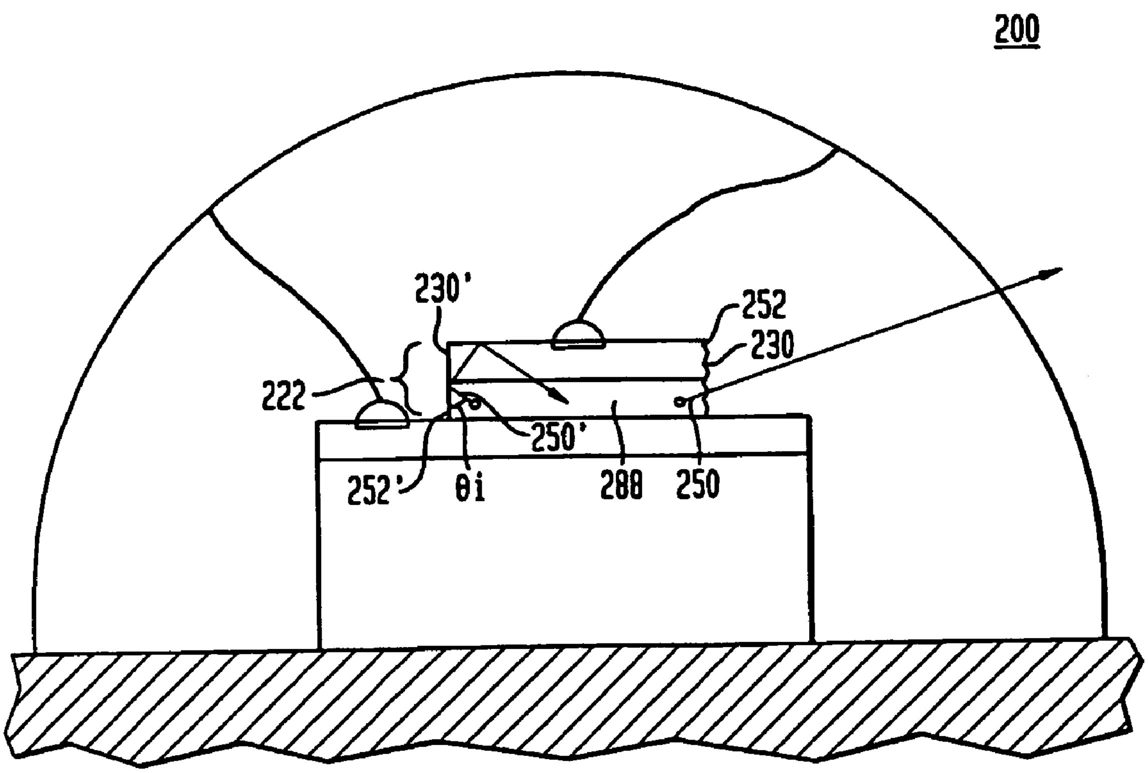
FIG. 4 shows a front elevation view of a LED package, including a mesa with one or more roughened sidewalls, in accordance with certain preferred embodiments of the present invention.

A package including an LED having one or more roughened sidewalls is shown in FIG. 4. The package comprises a light-emitting diode having a mesa 222 with one or more roughened sidewalls. Mesa 222 has a first sidewall 230 which has been etched to produce a roughened surface and a second sidewall 230' which is substantially smooth. In certain preferred embodiments, the second sidewall 230' may remain smooth by not etching the second sidewall during the above-described etching process. A first light ray 250 generated at junction layer 288 impinges upon roughened sidewall 230 at incident angle $\theta_i$ that is less than $\theta_c$. The first light ray 250 passes through an interface 252 between roughened sidewall 230 and encapsulant layer 254, and is extracted from LED package 200. A second light ray 250' generated in the junction 288 is directed toward the substantially smooth sidewall 230'. Because $\theta_i>\theta_c$ at interface 252', light ray 250' is totally internally reflected within the package and is not extracted therefrom. Although the present invention is not limited by any particular theory of operation, it is believed that the roughened sidewall(s) 230 of the mesa increases the percentage of light rays that are successfully emitted from the package, thereby enhancing the efficiency of the package.

Figure 5:
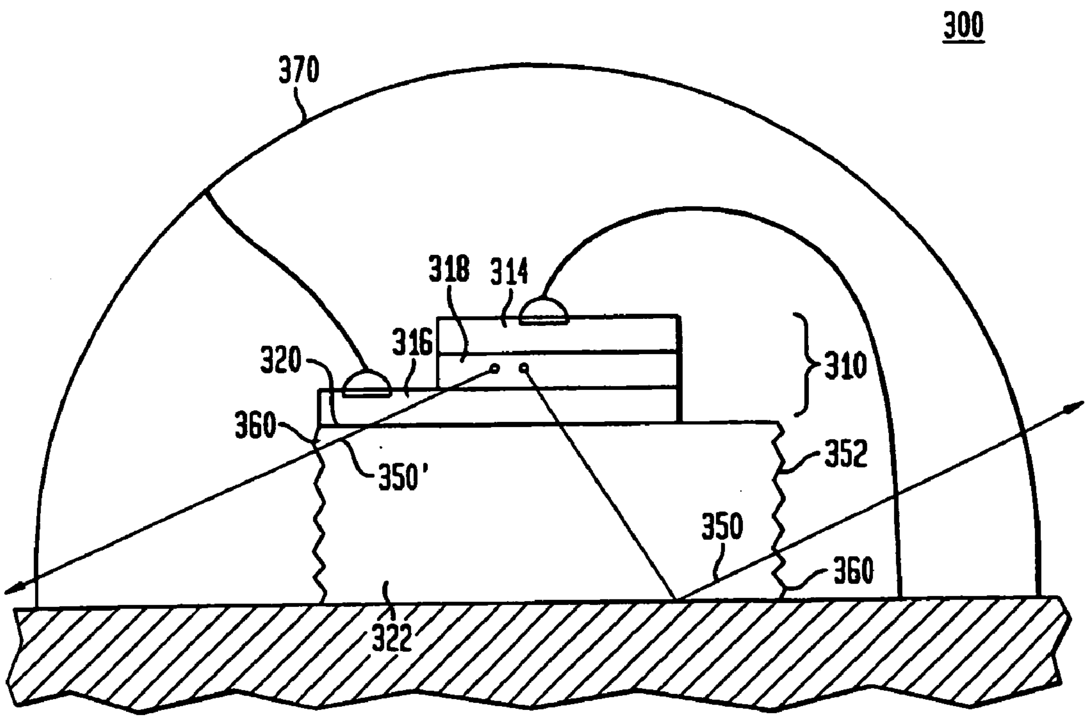
FIG. 5 shows a front elevation view of a LED package including a substantially transparent substrate having roughened sidewalls, in accordance with further preferred embodiments of the present invention.

Referring to FIG. 5, in accordance with other preferred embodiments of the present invention, a method of making light-emitting packages produces a package 300 having a substantially transparent substrate 322 with one or more roughened sidewalls. The substrate preferably comprises a dielectric material, such as sapphire. As shown in FIG. 5, light-emitting package 300 includes LED 310 having a first region 314 of a first conductivity type, a second region 316 of a second conductivity type and a junction layer 318 between the first and second regions. The LED 310 is mounted atop a first surface 320 of the substantially transparent substrate 322. During a processing step, one or more LEDs 310 may be mounted atop the substantially transparent substrate 322. The substantially transparent may be severed to produce individual LED packages, each package including an LED and a portion of the separated substrate. The substrate may be separated using a saw that produces the one or more roughened sidewalls 360. Alternatively, the substrate may be separated using laser ablation. In other embodiments, the substrate may be separated using other well known techniques to produce roughened sidewalls. Although the present invention is not limited by any particular theory of operation, it is believed that providing a substantially transparent substrate having roughened sidewalls 360 will minimize the number of light rays that are internally reflected, thereby improving light extraction from the LED package. As shown in FIG. 5, first and second light rays 350, 350' are able to pass through roughened sidewalls 360, into encapsulant 370, and be extracted from package 300. However, in conventional packages having smooth sidewalls, light rays 350, 350' would be totally internally reflected within the substrate.

In certain preferred embodiments, the roughness formed in the sidewalls 360 is preferably of a length on the order of one-half the wave length in air of the light generated at junction layer 318 of LED 310. In certain preferred embodiments, when using a GaN LED that produces light having a wavelength of approximately 450 nanometers, the length of roughness formed in the sidewalls 360 is comparable with that light's wavelength in the GaN material, i.e. between about 40–700 nanometers. The method used to produce the roughness is preferably reproducible so that the required length of the roughness in the substrate sidewalls may be readily reproduced. In embodiments having roughened substrate sidewalls, it is preferable that the surfaces of the LED package having electrical contacts remain substantially smooth.

One preferred method for producing a substrate having roughened substrate sidewalls includes using an etching process whereby a metal mask is provided over a top surface of the substrate. The periphery of the mask is etched to produce a mask having rough edges of desired dimensions. In other preferred embodiments, the etching process desirably uses a conventional photoresist material with suitable nanoparticles of a material that etches at a different rate than the host material, thereby imparting a roughness of a desired dimension to the sidewalls 360 of the substrate 322. In still other preferred embodiments, the substantially transparent substrate 322 may contain a plurality of sidewalls, however, less than all of the sidewalls may have a roughened surface. In one particular preferred embodiment, a substrate has four sidewalls, whereby two of the sidewalls are roughened and two of the sidewalls are smooth.

Figure 6:
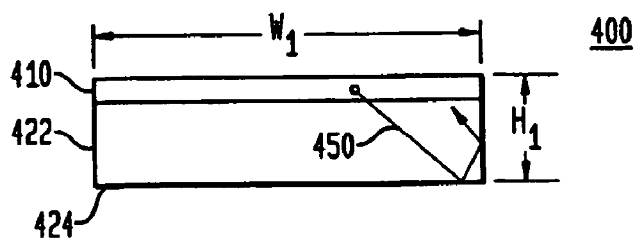
FIG. 6 shows a front elevation view of a conventional LED package.

FIG. 6 shows a simplified view of a conventional light-emitting package 400 having a width to height aspect ratio of greater than 2.5 to 1. Specifically, the width $W_1$ of package 400 is approximately 14 mils and the height $H_1$ of package is approximately 5 mils. The above-mentioned dimensions provide a package 400 having an aspect ratio of 2.8:1. Because the aspect ratio of the package is 2.8:1, a light ray 450 generated by LED 410 is reflected off a bottom surface 424 of substrate 422 and back into the LED package 400. Such total internal reflection of light ray 450 is undesirable because the amount of light extracted from package 400 is reduced.

Figure 7:
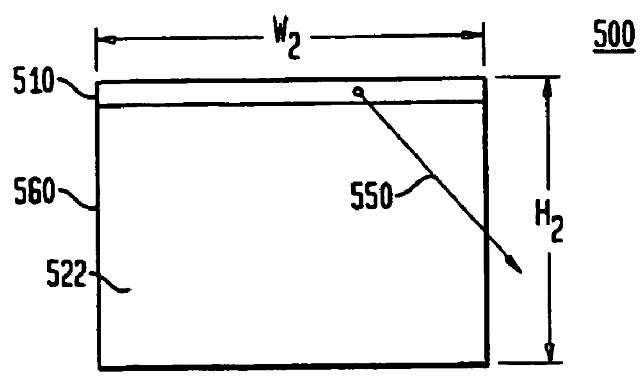
FIG. 7 shows a front elevation view of a LED package having an aspect ratio that is less than 2:1, in accordance with still further preferred embodiments of the present invention.

Referring to FIG. 7, in one preferred embodiment of the present invention, a light-emitting package 500 has an aspect ratio (the ratio of width to height) that is less than 2:1. Specifically, package 500 has a width $W_2$ that is approximately 14 mil and a height $H_2$ that is approximately 14 mil. In other words, the aspect ratio of width to height is approximately 1:1. Thus, the sidewalls 560 of substrate 522 are significantly higher than the sidewalls of the LED package shown in FIG. 6. As a result, a light ray 550 emitted from LED 510 will pass through the sidewall 560 of substrate 522 and be extracted from LED package 500. This is a dramatic improvement over the package shown in FIG. 6, wherein a light ray having a similar direction of propagation is totally internally reflected. Thus, providing a LED package having an aspect ratio of less than or equal to 2:1 will optimize light extraction from the LED package.

These and other variations and combinations of the features discussed above can be utilized without departing from the present invention. Thus, the foregoing description of preferred embodiments should be taken by way of illustration rather than by way of limitation of the invention as defined by the claims.

What is claimed is:

1. A light-emitting microelectronic package comprising:

a light-emitting diode including a first region of a first conductivity type, a second region of a second conductivity type, and a light-emitting p-n junction between said first and second regions, said light-emitting diode defining a lower contact surface and a mesa projecting upwardly from said lower contact surface, said first region of a first conductivity type being disposed in said mesa and defining a top surface of said mesa, said second region of a second conductivity type defining said lower contact surface that substantially surrounds said mesa, wherein said mesa includes at least one sidewall extending between said top surface of said mesa and said lower contact surface, said at least one sidewall having a roughened surface for improving light extraction from said package.

2. The package as claimed in claim 1, wherein said light-emitting diode is a GaN semiconductor.

3. The package as claimed in claim 1, wherein said light-emitting diode overlies a substantially transparent dielectric substrate.

4. The package as claimed in claim 3, wherein said substantially transparent dielectric substrate has a top surface, a bottom surface and at least one sidewall extending between said top and bottom surfaces.

5. The package as claimed in claim 4, wherein said at least one sidewall of said substantially transparent dielectric substrate has a roughened surface.

6. The package as claimed in claim 3, wherein said package has a width and a height, the ratio of said width to said height defining an aspect ratio for said package that is 2:1 or less.

7. The package as claimed in claim 1 wherein said light-emitting diode further comprises: an upper contact accessible at the top surface of said mesa; and a lower contact accessible at the lower contact surface of said diode.

8. The package as claimed in claim 1, wherein said mesa is generally in the form of a rectangular solid and said top surface of said mesa is substantially rectangular.

9. The package as claimed in claim 8, wherein the top surface of said mesa is substantially square.

10. The package as claimed in claim 1 wherein said lower contact is a substantially rectangular loop overlying said lower contact surface and substantially surrounding said mesa.

11. The package as claimed in claim 1, wherein said light-emitting diode includes an indentation in at least one sidewall of said mesa, said indentation extending downwardly from the top surface of said mesa to said lower contact surface, said lower contact being at least partially disposed within said indentation.

12. The package as claimed in claim 11, wherein said indentation extends into said mesa at a corner of the top surface of said mesa.

13. The package as claimed in claim 1, wherein said first conductivity type is a p-type and said second conductivity type is an n-type.

14. The package as claimed in claim 1, wherein said substantially transparent substrate comprises a material selected from the group consisting of sapphire, GaN, AlN, ZnO, and LiGaO.

15. The package as claimed in claim 1, wherein said light-emitting diode is a GaN light-emitting diode and said substantially transparent dielectric substrate is made of sapphire.

16. A light-emitting diode package comprising:

a substantially transparent dielectric substrate having a top surface, a bottom surface and at least one sidewall extending between the top and bottom surfaces; a light-emitting diode overlying said substantially transparent dielectric substrate, said light-emitting diode including a first region of a first conductivity type, a second region of a second conductivity type which defines a lower contact surface and a light-emitting p-n junction between said regions, and defining a mesa projecting upwardly from said lower contact surface, said first region of a first conductivity type being disposed in said mesa and defining a top surface of said mesa, wherein said mesa includes at least one sidewall extending between said top surface of said mesa and said lower contact surface;

wherein the at least one sidewall of said substantially transparent dielectric substrate has a roughened surface.

17. The package as claimed in claim 16, wherein said at least one sidewall of said mesa has a roughened surface for improving light extraction from said package.

18. The package as claimed in claim 16, wherein said light-emitting diode is a GaN semiconductor.

19. A light-emitting microelectronic package comprising:

a substantially transparent dielectric substrate having a top surface, a bottom surface and at least one sidewall extending between the top and bottom surfaces;

a light-emitting diode overlying said substantially transparent dielectric substrate, said light-emitting diode including a first region of a first conductivity type, a second region of a second conductivity type and a light-emitting p-n junction between said regions that emits light having a wavelength, wherein the at least one sidewall of said substantially transparent dielectric substrate includes a roughened surface having a pattern that is matched to the wavelength of the light emitting by the light-emitting p-n junction for optimizing the amount of light emitted from said package.

20. The package as claimed in claim 19, wherein said light-emitting diode is a GaN semiconductor and said substrate is made of sapphire.

* * * * *